US010765051B2

United States Patent
Hosaka et al.

(10) Patent No.: US 10,765,051 B2
(45) Date of Patent: Sep. 1, 2020

(54) CONTROL DEVICE

(71) Applicant: FUJI MACHINE MFG. CO., LTD., Chiryu-shi (JP)

(72) Inventors: Hideki Hosaka, Anjo (JP); Kazumi Hoshikawa, Toyohashi (JP)

(73) Assignee: FUJI CORPORATION, Chiryu-shi (JP)

( * ) Notice: Subject to any disclaimer, the term of this patent is extended or adjusted under 35 U.S.C. 154(b) by 274 days.

(21) Appl. No.: 15/758,149

(22) PCT Filed: Sep. 15, 2015

(86) PCT No.: PCT/JP2015/076082
§ 371 (c)(1),
(2) Date: Mar. 7, 2018

(87) PCT Pub. No.: WO2017/046862
PCT Pub. Date: Mar. 23, 2017

(65) Prior Publication Data
US 2018/0263152 A1 Sep. 13, 2018

(51) Int. Cl.
*H05K 13/08* (2006.01)
*H05K 13/04* (2006.01)
(Continued)

(52) U.S. Cl.
CPC ............ *H05K 13/08* (2013.01); *G01N 21/94* (2013.01); *G05B 15/02* (2013.01);
(Continued)

(58) Field of Classification Search
CPC .. H05K 13/0409; H05K 13/08; H05K 13/081; G01N 21/94; G01N 21/952; G05B 15/02
See application file for complete search history.

(56) References Cited

U.S. PATENT DOCUMENTS 6,041,494 A * 3/2000 Mimura ............. H05K 13/0452
29/832
7,762,643 B2 * 7/2010 Sakai ..................... B41J 2/2146
347/15
(Continued)

FOREIGN PATENT DOCUMENTS

DE    199 09 298 A1    9/2000
DE    102 50 916 A1    5/2004
(Continued)

OTHER PUBLICATIONS

Extended European Search Report dated Jul. 30, 2018 in Patent Application No. 15904051.8, 8 pages.
(Continued)

*Primary Examiner* — Shaghayegh Azima
(74) *Attorney, Agent, or Firm* — Oblon, McClelland, Maier & Neustadt, L.L.P.

(57) ABSTRACT

When performing inspection of a tip of a suction nozzle, the tip of the suction nozzle is imaged, and an opening of the tip of the suction nozzle is identified based on the image data. With the image based on the image data, locations with less than a set brightness level inside a location with the set brightness level and greater is identified as the opening. The identified opening is divided into four regions by boundary lines, and the area of the opening is calculated for each of the regions. Based on the areas calculated for each region, it is determined whether the suction nozzle is good. By determining whether the suction nozzle is good based on the area of the opening for each region, it is possible to reliably determine whether the suction nozzle is good.

2 Claims, 6 Drawing Sheets

(51) Int. Cl.
*G01N 21/94* (2006.01)
*G05B 15/02* (2006.01)
*G01N 21/952* (2006.01)

(52) U.S. Cl.
CPC ....... *H05K 13/0409* (2018.08); *H05K 13/081* (2018.08); *G01N 21/952* (2013.01)

(56) References Cited

U.S. PATENT DOCUMENTS

2005/0258381 A1* 11/2005 Kawase ............. H05K 13/0812 250/559.45
2013/0070011 A1*  3/2013 Nishida ............. H04N 1/00053 347/12
2013/0100189 A1*  4/2013 Azuma ................ B41J 2/16579 347/14
2013/0329144 A1* 12/2013 Fukasawa .............. B41J 29/393 349/19
2014/0093139 A1*  4/2014 Yamagishi ......... H04N 1/00015 382/112

FOREIGN PATENT DOCUMENTS

| EP | 0 851 728 A1 | 7/1998 |
| EP | 1 529 424 A1 | 5/2005 |
| JP | 6-209189 | 7/1994 |
| JP | 10-13093 | 1/1998 |
| JP | 10-154899 | 6/1998 |
| JP | 2007-266645 | 10/2007 |

OTHER PUBLICATIONS

International Search Report dated Dec. 15, 2015 in PCT/JP2015/076082 filed Sep. 15, 2015.

* cited by examiner

CONTROL DEVICE

TECHNICAL FIELD

The present disclosure relates to a control device for determining whether a suction nozzle is good.

BACKGROUND ART

An opening is formed in a tip of a suction nozzle, and a component is picked up and held at the opening by air being sucked at the opening. Therefore, there are cases in which a component cannot be held appropriately if the opening is damaged or if foreign matter or the like adheres to the opening. Therefore, it is necessary to inspect the state of the tip of a suction nozzle. In the patent literature below, the area of an opening of a suction nozzle is calculated based on image data, and in a case in which the calculated value is different to a set value, the suction nozzle is determined to be defective.

Patent literature 1: JP-A-H6-209189

SUMMARY

According to technology disclosed in the above patent literature, it is possible to a certain extent to determine whether a suction nozzle is good. However, for example, there are cases in which an opening of a suction nozzle is made larger at a given portion by damage or the like, but is made smaller at a different portion by foreign matter adhering to the opening. In such a case, the area of the opening of the suction nozzle will be roughly the same as the area of the opening of a normal nozzle, so a defective nozzle may be mistakenly determined to be a normal nozzle. The present disclosure takes account of such circumstances, and an object thereof is to reliably determine whether a suction nozzle is good.

To solve the above problems, a control device of the present disclosure includes: a calculating section configured to identify an opening of a tip of a suction nozzle used in a component mounter based on image data of the tip of the suction nozzle, divide the identified opening into multiple regions, and calculate an area of the identified opening for each of the multiple regions; and a determining section configured to determine whether the suction nozzle is good based on the area calculated by the calculating section for each of the multiple regions.

With the disclosed control device, an opening of the tip of a suction nozzle is identified based on image data of the tip of the suction nozzle. Further, the identified opening is divided into multiple regions, and the area of the identified opening is calculated for each of the multiple regions. Then, whether the suction nozzle is good is determined based on the calculated areas for each of the multiple regions. Thus, for example, even in a case in which the overall area of the opening of a defective nozzle is roughly the same as the overall area of the opening of a good nozzle, by determining whether the suction nozzle is good based on the area of the opening for each region, it is possible to reliably determine whether the suction nozzle is good.

DESCRIPTION OF PREFERRED EMBODIMENTS

The following describes in detail referring to the figures an example embodiment of the present disclosure.

Configuration of Electronic Component Mounting Device

Figure 1:
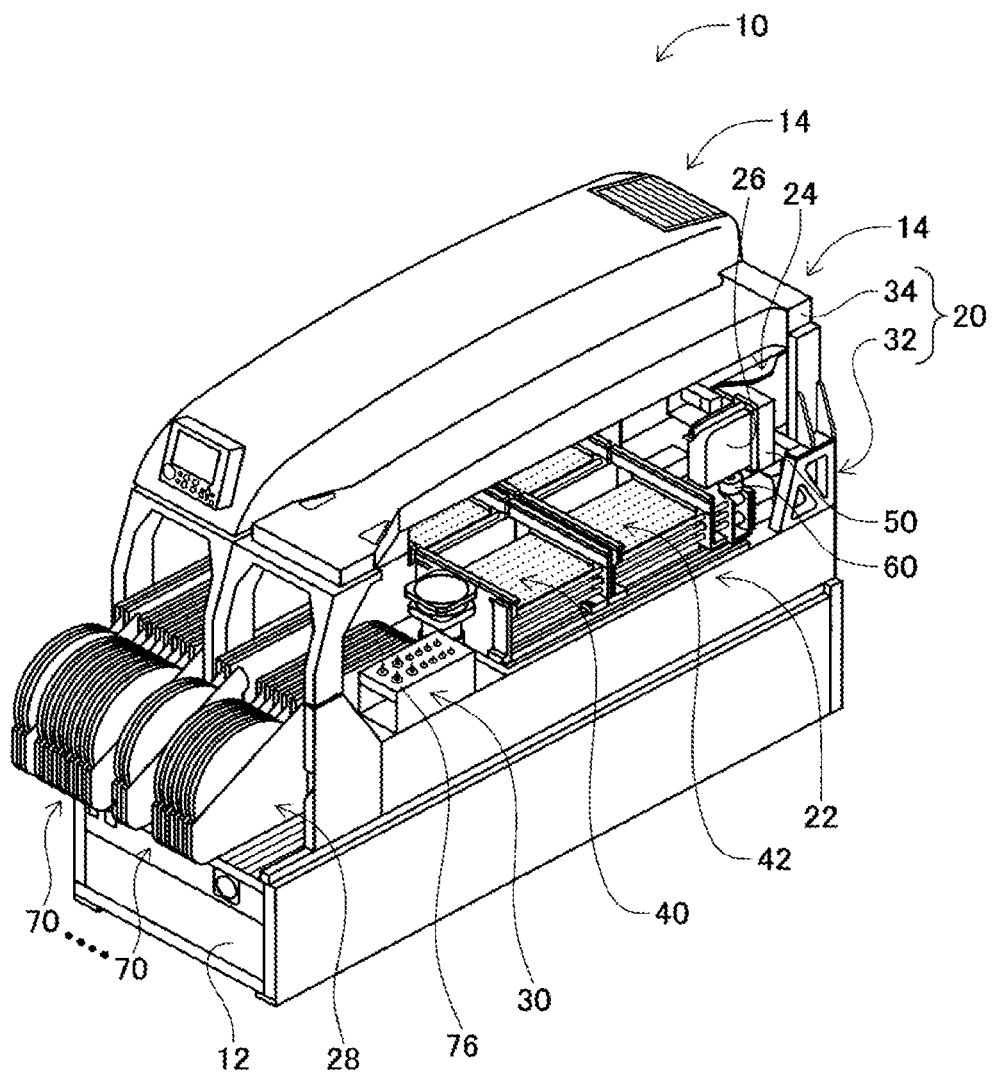
FIG. 1 is a perspective view of an electronic component mounting device.

FIG. 1 shows electronic component mounting device 10. Electronic component mounting device 10 includes one system base 12, and two electronic component mounters (hereinafter in some cases abbreviated to "mounter") 14 provided adjacently to each other on system base 12. Note that, the direction in which the mounters 14 are lined up is referred to as the X-axis direction, and the horizontal direction which is perpendicular to the X-axis direction is referred to as the Y-axis direction.

Each mounter 14 is provided mainly with mounter body 20, conveyance device 22, mounting head moving device (hereinafter in some cases abbreviated to "moving device") 24, mounting head 26, supply device 28, and nozzle station 30. Mounter body 20 is configured from frame 32 and beam 34 that is mounted on the frame 32.

Conveyance device 22 is provided with two conveyor devices 40 and 42. The two conveyor devices 40 and 42 are parallel to each other and are provided on frame 32 extending in the X-axis direction. Each of the two conveyor devices 40 and 42 conveys a circuit board held on the respective conveyor devices 40 and 42 in the X-axis direction using an electromagnetic motor (not shown). Also, the circuit board is held at a predetermined position by a board holding device (not shown).

Moving device 24 is an XY robot type moving device. Moving device 24 is provided with an electromagnetic motor (not shown) that slides a slider 50 in the X-axis direction, and an electromagnetic motor (not shown) that slides slider 50 in the Y-axis direction. Mounting head 26 is attached to slider 50, and the mounting head 26 is moved to any position on frame 32 by the operation of the two electromagnetic motors.

Mounting head 26 mounts electronic components on a circuit board. Mounting head 26 includes suction nozzle 60 provided on a lower end surface of mounting head 26. Suction nozzle 60 is connected to a positive/negative pressure supply device (not shown) via a negative pressure air and positive pressure air passage. Suction nozzle 60 picks up and holds an electronic component using negative pressure, and releases the held electronic component using positive pressure. Also, mounting head 26 includes a raising and lowering device (not shown) that raises and lowers suction nozzle 60. Mounting head 26 changes the vertical position of a held electronic component using the raising and lowering device. Note that, suction nozzle 60 is removably attached to mounting head 26, such that suction nozzles can be exchanged in accordance with the electronic component to be held.

Supply device 28 is a feeder type supply device that has multiple tape feeders 70. Tape feeders 70 house taped components in a wound state. Taped components are electronic components that have been put into tape. Tape feeders 70 deliver the taped components using a feeding device (not shown). Accordingly, feeder type supply device 28 supplies an electronic component to a supply position through the feeding delivery of the taped components.

Nozzle station 30 includes nozzle tray 67. Multiple suction nozzles 60 are housed in nozzle tray 76. In the nozzle station 30, exchanging of a suction nozzle 60 attached to mounting head 26 with a suction nozzle 60 housed in nozzle tray 76, and the like is performed as necessary. Nozzle tray 76 is capable of being attached and detached in relation to nozzle station 30, such that the collection of suction nozzles 60 housed in nozzle tray 76, replenishment of suction nozzles 60 to nozzle tray 76, and the like can be performed outside of mounter 14.

Mounting Work by a Mounter

It is possible to perform mounting work with respect to a circuit board held in conveyance device 22 using mounting head 26 in mounter 14 with the above configuration. Specifically, based on commands of a control device (not shown) of mounter 14, a circuit board is conveyed to a work position, and the circuit board is held at that position by a board holding device. Also, based on commands of the control device, tape feeder 70 feeds taped components and supplies an electronic component to a supply position. Then, mounting head 26 moves above the supply position of the electronic component and picks up and holds the electronic component using suction nozzle 60. Continuing, mounting head 26 moves above the circuit board and mounts the held electronic component on the circuit board.

In mounter 14, as given above, an electronic component supplied by tape feeder 70 is picked up and held by suction nozzle 60 and then mounted on the circuit board. Thus, if a problem occurs with suction nozzle 60, mounting work may not be able to be performed properly, and appropriate management of suction nozzle 60 is required. Thus, management of suction nozzle 60 is performed by the nozzle management device as described below.

Configuration of Nozzle Management Device

Figure 2:
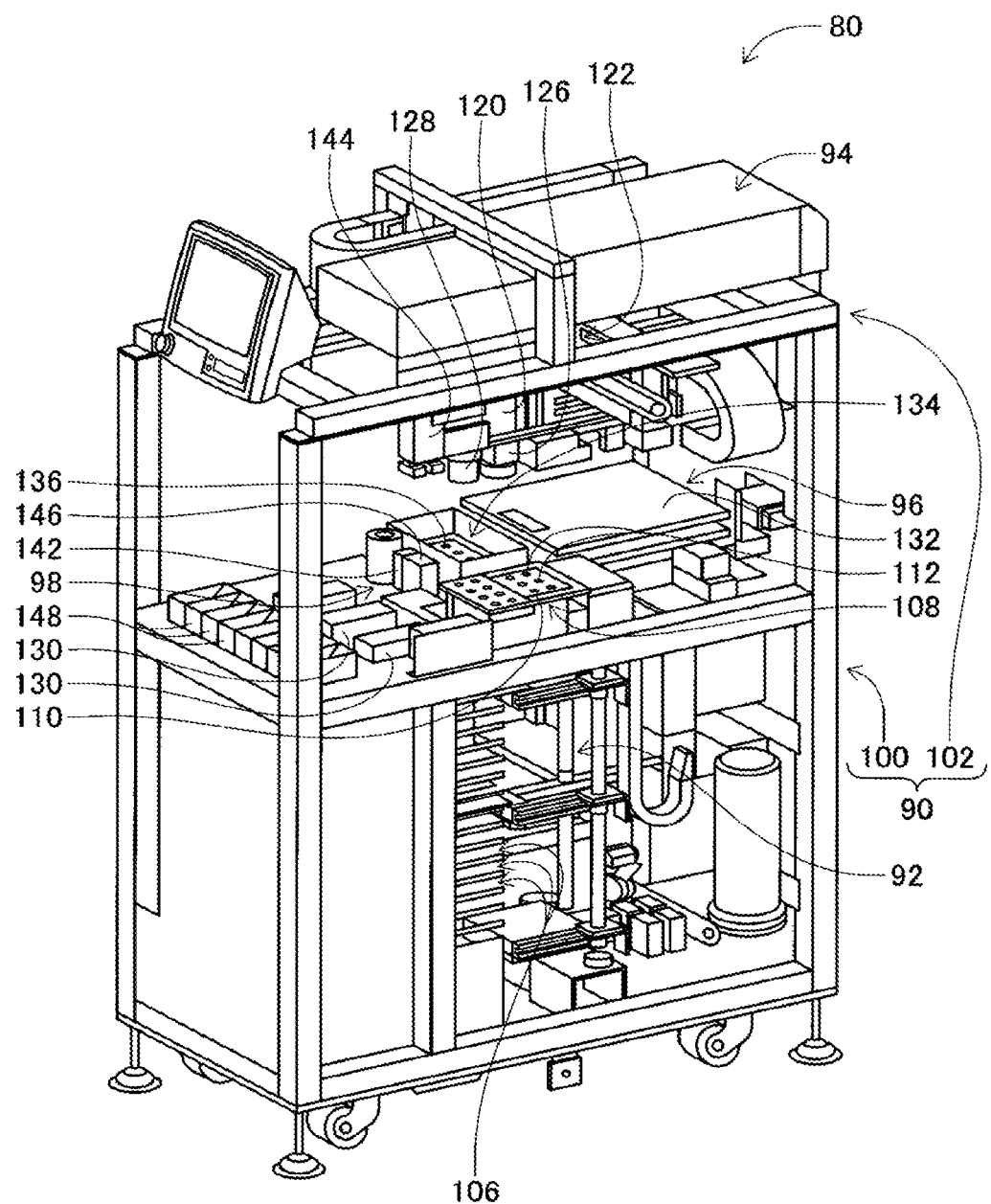
FIG. 2 is a perspective view of a nozzle management device.

As shown in FIG. 2, nozzle management device 80 includes management device main body 90, pallet housing device 92, nozzle transfer device 94, nozzle cleaning device 96, and nozzle inspection device 98. Note that, FIG. 2 is a perspective view showing nozzle management device 80 with outer covers removed to illustrate the internal configuration of nozzle management device 80.

Management device main body 90 is configured from frame section 100 and beam section 102 that is mounted on frame section 100. Frame section 100 is hollow with pallet housing device 92 provided inside frame section 100, and an upper end section of pallet housing device 92 exposed at the top surface of frame section 100.

Pallet housing device 92 includes multiple pallet loading shelves 106 and support arm 108. Pallet loading shelf 106 is for loading a nozzle pallet 110 on, and multiple pallet loading shelves 106 are arranged vertically inside frame section 100. Multiple loading holes 112 are formed in nozzle pallet 110, and suction nozzles 60 are housed inside loading holes 112. Also, support arm 108, by operation of an arm moving device (not shown), in front of the multiple pallet loading shelves 106, moves in a vertical direction and in a direction towards and away from pallet loading shelves 106. By this, stowing of nozzle pallet 110 to pallet loading shelf 106 and removing of nozzle pallet 110 from pallet loading shelf 106 is performed by support arm 108. Note that, nozzle pallet 110 removed from pallet loading shelf 106 is moved to the upper side of frame section 100 by support arm 108 moving up.

Nozzle transfer device 94 is for transferring suction nozzles 60 and is provided on beam section 102. Nozzle transfer device 94 includes transfer head 120 and head moving device 122. Camera 126 facing downwards and holding chuck 128 for holding suction nozzle 60 are provided on a lower surface of transfer head 120.

Also, head moving device 122 is suspended from beam section 102 and is an XYZ-type moving device that moves transfer head 120 forwards/backwards, left/right, and up/down on frame section 100. On the front upper surface of frame section 100, fixing stage 130 on which nozzle tray 76 is set is provided, and suction nozzles 60 are transferred to and from nozzle tray 76 set on fixing stage 130 and nozzle pallet 110 supported on support arm 108 of pallet housing device 92.

Nozzle cleaning device 96 is for cleaning and drying suction nozzles 60, and is arranged next to pallet housing device 92. Nozzle cleaning device 96 is provided with cleaning and drying mechanism 132, and cleaning pallet moving device 134. Cleaning and drying mechanism 132 performs cleaning and drying of suction nozzle 60 internally. Also, cleaning pallet moving mechanism 134 moves cleaning pallet 136 to and from an exposed position in which cleaning pallet 136 is exposed (the position of cleaning pallet 136 in FIG. 2) and a position inside cleaning and drying mechanism 132.

When cleaning is performed of a suction nozzle 60 by nozzle cleaning device 96, the suction nozzle 60 that is to be cleaned is moved by nozzle transfer device 94 from nozzle tray 76 or nozzle pallet 110 to cleaning pallet 136. Then, by operation of cleaning pallet moving mechanism 152, cleaning pallet 158 is moved inside cleaning and drying mechanism 150, and cleaning and drying of suction nozzle 60 is performed inside cleaning and drying mechanism 150. When the cleaning and the drying of the suction nozzle 60 is completed, by operation of cleaning pallet moving mechanism 134, cleaning pallet 136 is moved to the exposed position, and the suction nozzle is returned from cleaning pallet 136 to nozzle tray 176 or nozzle pallet 110.

Nozzle inspection device 98 inspects suction nozzle 60 cleaned by nozzle cleaning device 96, and includes load cell 142, air supply device 144, and camera 146.

Load cell 142 is arranged next to cleaning pallet moving mechanism 134, and the expansion-contraction state of the tip of suction nozzle 60 is inspected using load cell 142. In detail, suction nozzle 60 to be inspected is held by holding chuck 128, and the end section of the suction nozzle 60 held by holding chuck 128 is contacted against load cell 142. The end section of suction nozzle 60 can be expanded and contracted, and the expansion-contraction state of the end section of suction nozzle 60 is inspected based on the load measured by load cell 142.

Also, air supply device 144 is attached to transfer head 120 of nozzle moving device 94, and air flow amount inspection of suction nozzle 60 is performed using air supply device 144. In detail, by operation of head moving device 122, air supply device 144 moves above a suction nozzle 60 loaded in one of nozzle tray 76, nozzle pallet 110, or cleaning pallet 136. Then, air supply device 144 is connected to the suction nozzle 60 to be inspected and air is supplied from air supply device 144. Here, the air flow amount is measured such that air flow amount inspection of suction nozzle 60 is performed.

Figure 3:
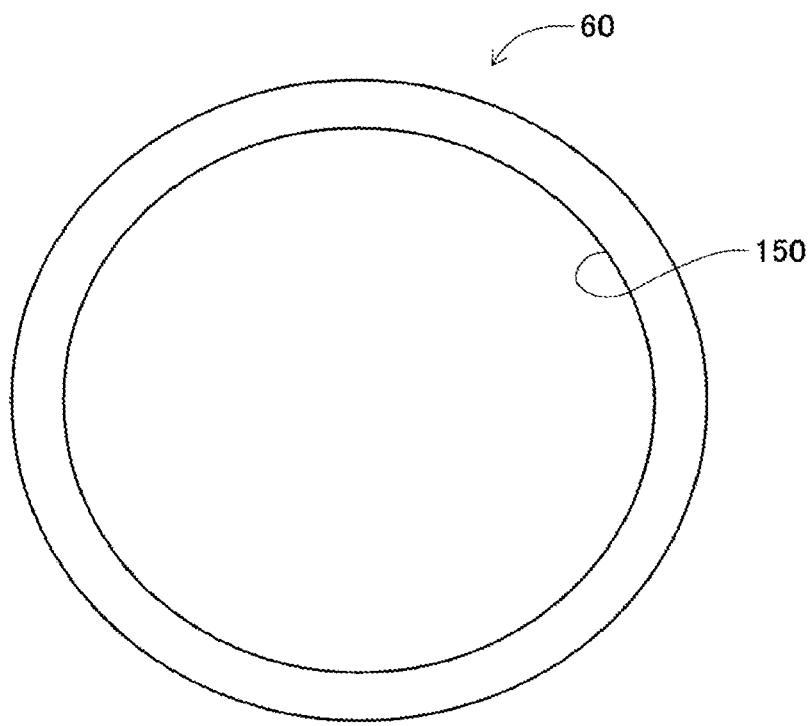
FIG. 3 shows the tip of a regular suction nozzle.

Also, camera 146 is arranged next to load cell 142 in a state facing upwards, and the tip of suction nozzle 60 is inspected using camera 146. In detail, suction nozzle 60 to be inspected is held by holding chuck 128 and the suction nozzle 60 held by the holding chuck 128 is moved above camera 146. Then, camera 146 images suction nozzle 60 from below. By this, image data of the tip of suction nozzle 60 is obtained. The tip of suction nozzle 60 is generally, as shown in FIG. 3, round, with round opening 150.

Therefore, it is possible to perform inspection of the tip of suction nozzle 60 using shape matching. Shape matching is an inspection method in which image data and round shape template image data created in advance are compared. If the correlation between the template image data and the image data is a threshold value or higher, the nozzle is determined to be normal. On the other hand, if the correlation between the template image data and the image data is below the threshold value, the nozzle is determined to be defective due to the presence of damage, adhering foreign matter, or the like.

Figure 4:
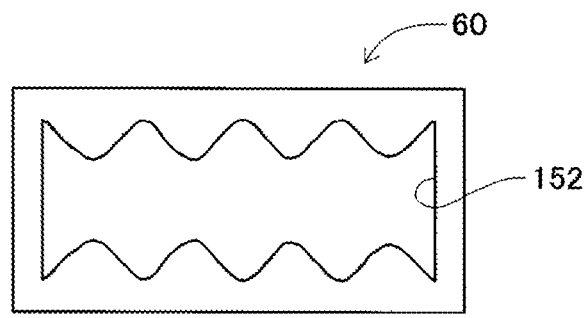
FIG. 4 shows the tip of a suction nozzle with an opening that has a complex shape.

However, in recent years, in accordance with the miniaturization of electronic components to be picked up, the tips of suction nozzles 60 have become smaller. And, with suction nozzles 60 with miniature tips, to maintain a suitable pickup area, and to achieve stable pickup, as shown in FIG. 4, opening 152 is made in a complex shape, not a round shape. Thus, it is difficult to create template image data the same shape as the tip of a suction nozzle with opening 152 that has a complex shape, and making such template image data is very time-consuming.

Figure 5:
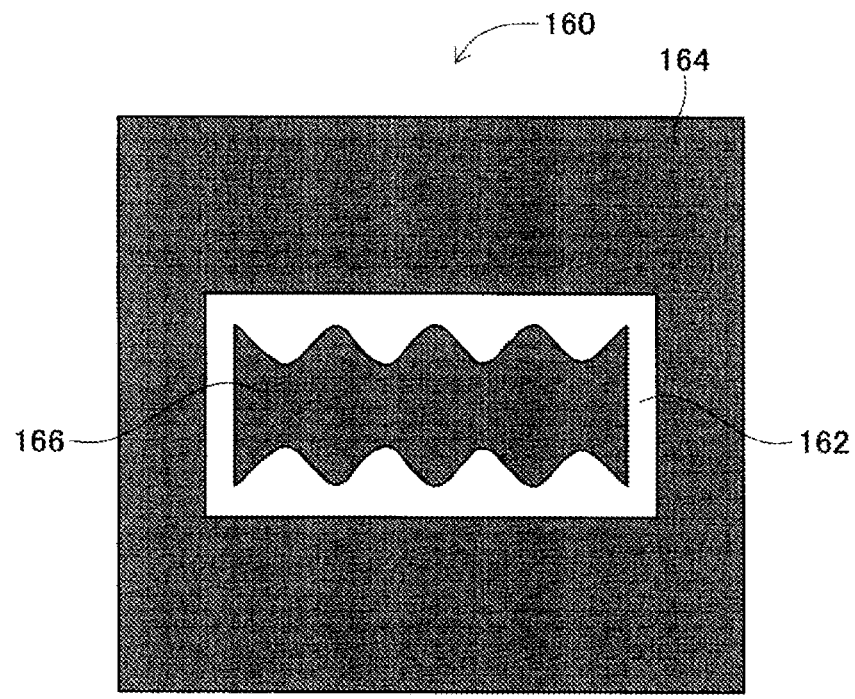
FIG. 5 shows an image based on image data of the tip of the suction nozzle of FIG. 4.

Therefore, the area determined to be opening 152 of suction nozzle 60 is calculated based on image data, and by comparing the calculated value to a predetermined set value, it is possible to inspect the tip of the suction nozzle 60. In detail, the image data of the opening of suction nozzle 60 with opening 152 that has a complex shape is divided into data representing a set brightness level and greater, and data representing less than the set brightness level. Accordingly, as shown in FIG. 5, image 160 based on the image data is divided into location 162 with the set brightness level and greater, and locations 164 and 166 with less than the set brightness level. Note that, location 162 with the set brightness level and greater displays as white, and locations 164 and 166 with less than the set brightness level display as black.

Note that, location 162 with the set brightness level and greater indicates the surface area of the tip of suction nozzle, because light is reflected by the surface area of the tip of suction nozzle 60, which increases the brightness level. On the other hand, location 164 with less than the set brightness level represents an area outside the surface area of the tip of suction nozzle 60, and location 166 with less than the set brightness level represents an area inside the surface area of the tip of suction nozzle 60, that is, opening 152. Therefore location 166 with less than the set brightness level that is surrounded by location 162 with the set brightness level and greater is identified as opening 152, and the area of location 166 with less than the set brightness level is calculated as the area of opening 152.

Also, area X of opening 152 of an actual suction nozzle 60 is measured and stored as set value X. Therefore, when the value calculated as the area of opening 152 is compared to set value X, if the difference between the calculated value and set value X is within a threshold value, the nozzle is determined to be normal, but if the difference between the calculated value and set value X is equal to or greater than a threshold value, the nozzle is determined to be defective. Thus, it is possible to perform inspection of the tip of suction nozzle 60 without creating template image data. Note that, in image 160 of FIG. 5, there are no defects such as damage or foreign matter, so the calculated value of the area of opening 152 that is calculated based on image 160 is approximately equal to set value X. Therefore, inspection of the tip of suction nozzle 60 based on image 160 of FIG. 5 determines the nozzle to be normal.

Figure 6:
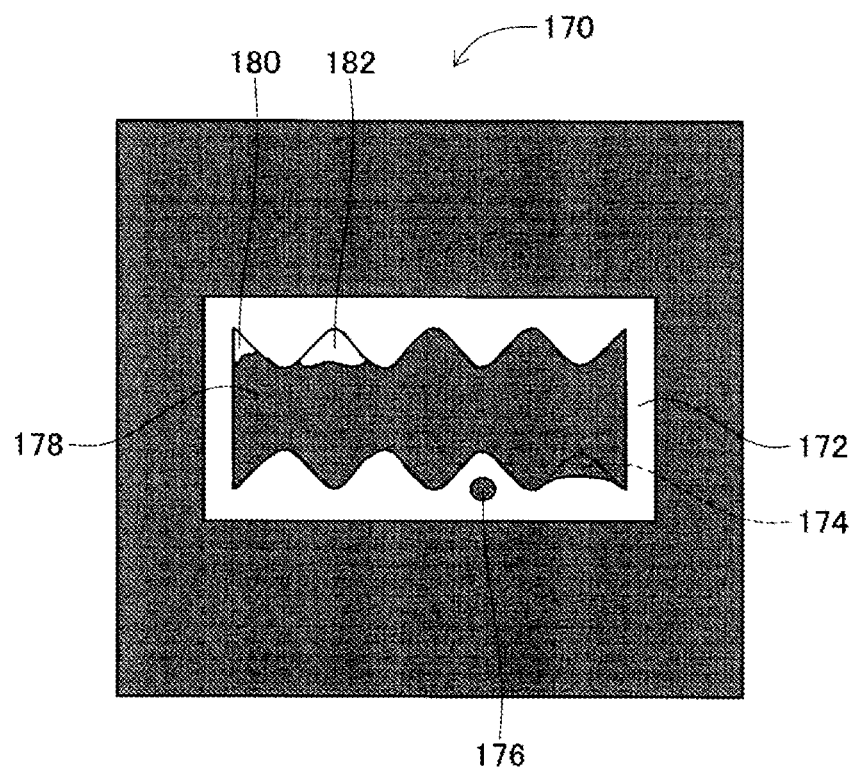
FIG. 6 shows an image based on image data of the tip of the suction nozzle of FIG. 4.

However, with an inspection method based only on the area of opening 152, there are cases in which inspection is not performed appropriately. Specifically, for example, shown in FIG. 6 is image 170 based on image data in a case in which there is damage and foreign matter adhering to the tip of suction nozzle 60. In image 170, similar to image 160 shown in FIG. 5, there is a location 172 with a set brightness level and greater. However, compared to location 162 with a set brightness level and greater of image 160 shown in FIG. 5, with location 172 with a set brightness level and greater, there are two locations, 174 and 176, with less than the set brightness level. Location 174 (indicated by a dashed line) represents a location where there is damage to the tip area of suction nozzle 60. Also, location 176 represents a location at which foreign matter is adhering to the tip area of suction nozzle 60.

Further, in image 170 of FIG. 6, similar to image 160 of FIG. 5, there is location 178 with less than the set brightness level inside location 172 with the set brightness level and greater. However, compared to location 166 with less than the set brightness level of image 160 shown in FIG. 5, with location 178 with less than the set brightness level, there are two locations, 180 and 182, with the set brightness level and greater. These two locations 180 and 182 represent locations inside suction nozzle 60, that is, opening 152, at which foreign matter is adhered.

Thus, when the area of opening 152 is calculated based on image data of image 170, the calculated value is approximately same as the calculated value of the area of opening 152 calculated based on the image data of image 160 shown in FIG. 5. In detail, as described above, the calculated value of the area of opening 152 is calculated as the surface area of the locations with less than the set brightness level surrounded by the locations with the set brightness level and higher. Therefore, with image 170 of FIG. 6, the surface area of locations 176 and 178 with less than the set brightness level surrounded by location 172 with the set brightness level and greater is calculated as the area of opening 152.

With image 160 of FIG. 5, the surface area of location 166 with less than the set brightness level surrounded by location 162 with the set brightness level and greater is calculated as the area of opening 152. Here, when comparing locations 176 and 178 with less than the set brightness level to location 166 with less than the set brightness level, the area (B) of locations 180 and 182 with the set brightness level and greater is subtracted from the area (A) of location 166 with less than the set brightness level, and then the area (C) of locations 174 and 176 with less than the set brightness level is added to give the area (D) of locations 176 and 178 with less than the set brightness level. That is, A−B+C=D. Also, with image 170 of FIG. 6, the area (B) of locations 180 and 182 with the set brightness level and greater is approximately the same as the area (C) of the two locations 174 and 176 with less than the set brightness level. Therefore, area (A) of location 166 with less than the set brightness level is the same as area (D) of locations 176 and 178 with less than the set brightness level. In other words, the calculated value of the area of opening 152 calculated based on image data of image 170 of FIG. 6 is approximately the same as the calculated value of the area of opening 152 calculated based on the image data of image 160 of FIG. 5.

Therefore, the calculated value of the area of opening 152 calculated based on the image data of image 170 of FIG. 6 is approximately the same as set value X, so with inspection of the tip of suction nozzle 60 based on image 170 of FIG. 6, the nozzle is determined to be normal. In this manner, in a case in which inspection of the tip of suction nozzle 60 is performed based on the area of opening 152 only, it is possible that a suction nozzle with damage or foreign matter adhering will be mistakenly determined to be a normal nozzle. Considering this problem, opening 152 of suction nozzle 60 identified based on the image data is divided into multiple regions, and the area of opening 152 of suction nozzle 60 identified based on the image data is calculated for each of the regions.

Specifically, first, boundary lines are decided for dividing opening 152 into multiple regions. In the present embodiment, opening 152 is divided into four regions. Thus, boundary lines are decided for dividing opening 152 into four regions. As a deciding method for the boundary lines, outer lines of the tip of suction nozzle 60 are recognized based on the image data. The outer line of the tip of suction nozzle 60 is the outline of the tip of suction nozzle 60, and the outline of location 172 with the set brightness level and greater in image 170 of FIG. 6 is recognized as the outer line of the tip of suction nozzle 60.

Figure 7:
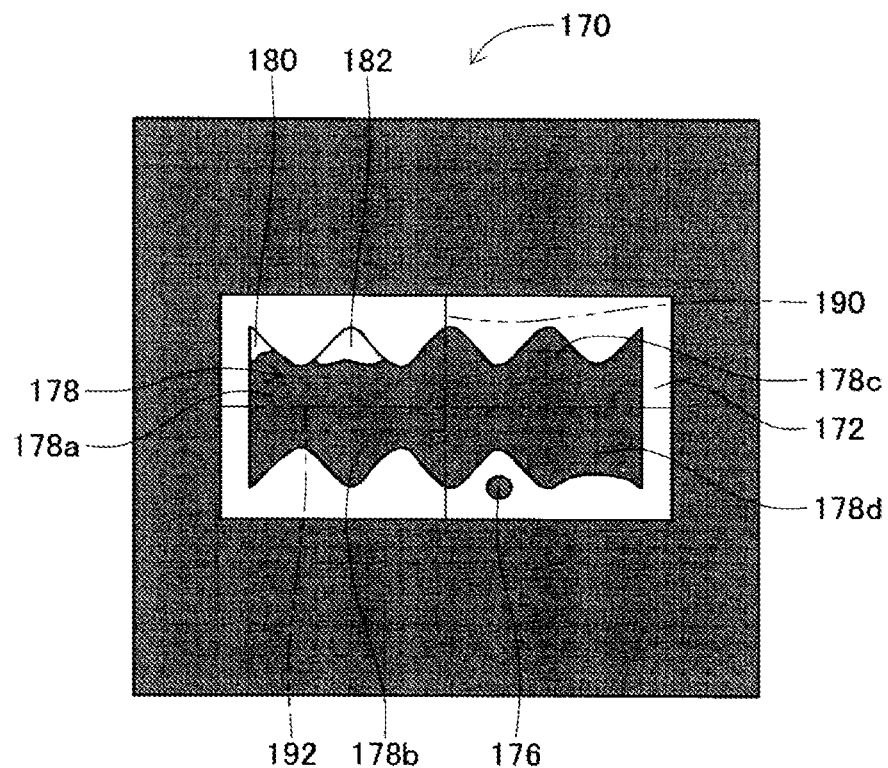
FIG. 7 shows an image based on image data of the tip of the suction nozzle of FIG. 4.

Thus, boundary lines are decided to divide opening 152 into four regions based on the outer lines of the tip of suction nozzle 60. In detail, as shown in FIG. 7, the outer lines of the tip of suction nozzle 60, that is, the outline of location 172 with the set brightness level and greater in image 170, form roughly a rectangle, so boundary line 190 is decided that runs parallel to the short sides of the rectangle and passes through a center point of the long sides of the rectangle. Also, boundary line 192 is decided that runs parallel to the long sides of the rectangle and passes through a center point of the short sides of the rectangle. Therefore, the location determined as opening 152 based on the image data, that is, locations 176 and 178 with less than the set brightness level surrounded by location 172 with the set brightness level and greater, is divided into four regions.

Continuing, the area of the location with less than the set brightness level is calculated for each region. Here, the area of the upper left region of the figure (hereinafter also referred to as a "first region"), is the area of location 178a above boundary line 192 and to the left of boundary line 190 among location 178 with less than the set brightness level. Also, the area of the lower left region of the figure (hereinafter also referred to as a "second region"), is the area of location 178b below boundary line 192 and to the left of boundary line 190 among location 178 with less than the set brightness level. Also, the area of the upper right region of the figure (hereinafter also referred to as a "third region"), is the area of location 178c above boundary line 192 and to the right of boundary line 190 among location 178 with less than the set brightness level. Also, the area of the lower right region of the figure (hereinafter also referred to as a "fourth region"), is the area of location 178d below boundary line 192 and to the right of boundary line 190 among location 178 with less than the set brightness level.

Next, the calculated value of the area calculated for each region is compared to a set value (X/4). Here, if the calculated value of the area calculated for each region is different to the set value (X/4) for at least one of the multiple regions, the nozzle is determined to be defective. On the other hand, if the calculated value of the area calculated for each region is the same as the set value (X/4) for all of the multiple regions, the nozzle is determined to be normal. Note that, the set value (X/4) is one quarter of the area X of opening 152 of the actual suction nozzle 60.

Specifically, in image 170 of FIG. 7, the calculated value of the area of the first region is smaller than the set value (X/4) due to the presence of foreign matter. Also, the calculated value of the area of the fourth region is larger than the set value (X/4) due to the presence of damage and foreign matter. Note that, the calculated value of the area of the second region and the calculated value of the area of the third region are the same as the set value (X/4). Therefore, with inspection of the tip of suction nozzle 60 based on image data of image 170 of FIG. 7, suction nozzle 60 of image 170 is determined to be defective.

Figure 8:
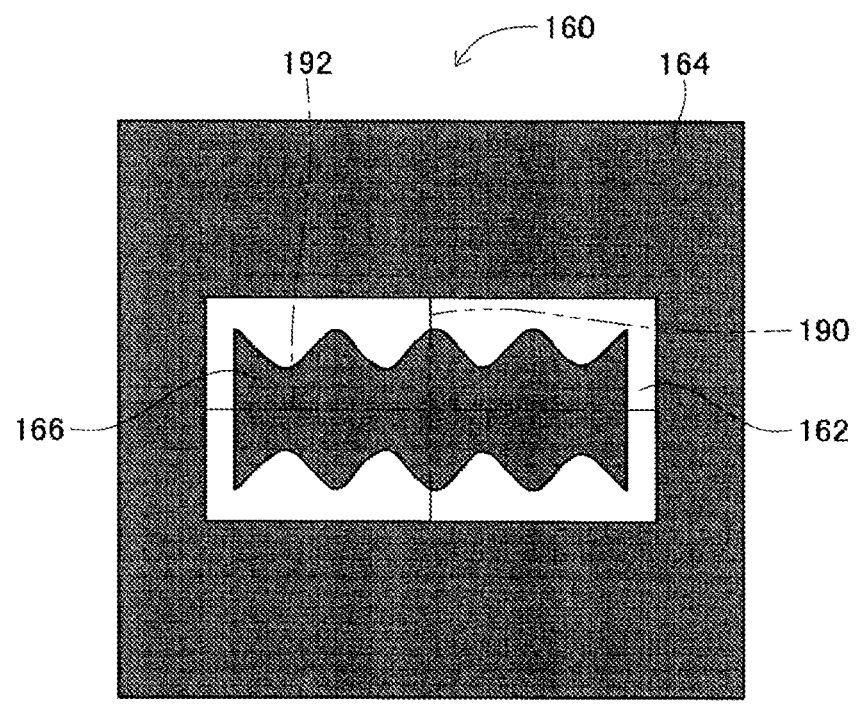
FIG. 8 shows an image based on image data of the tip of the suction nozzle of FIG. 4.

Also, if boundary lines 190 and 192 were marked in image 160 of FIG. 5, the location determined to be opening 152 based on the image data, that is, location 166 with less than the set brightness level surrounded by location 162 with the set brightness level and greater, as shown in FIG. 8, would be divided into four regions by boundary lines 190 and 192. With image 160 of FIG. 8, the calculated value of the area for each region is the same as the set value (X/4) for all of the regions. Therefore, with inspection of the tip of suction nozzle 60 based on image data of image 160 of FIG. 8, suction nozzle 60 of image 160 is determined to be normal.

In this manner, opening 152 of suction nozzle 60 identified based on image data is divided into multiple regions, and by performing inspection of the tip of suction nozzle 60 based on the area of opening 152 for each of the regions, it is possible to appropriately determine whether a suction nozzle 60 is good.

Note that, as shown in FIG. 2, multiple discard boxes 148 are provided on an upper surface of frame section 100 of nozzle management device 80, and suction nozzles 60 determined by the inspection to be defective suction nozzles are discarded in discard boxes 148. Further, suction nozzles 60 determined by the inspection to be normal are returned to nozzle tray 76 or nozzle pallet 110.

Figure 9:
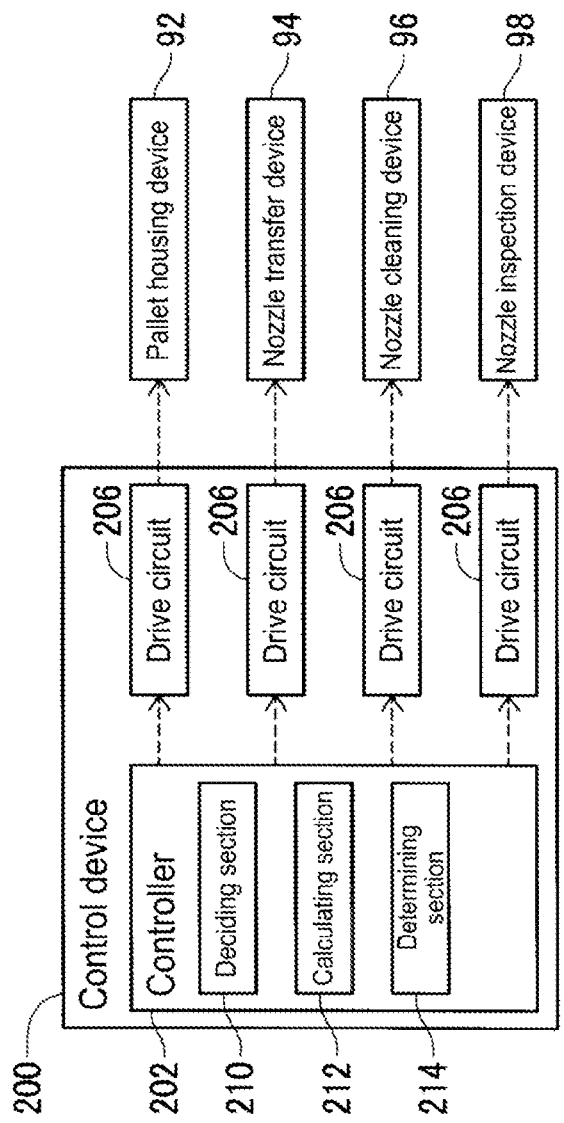
FIG. 9 is a block diagram showing a control device provided in the nozzle management device.

Further, as shown in FIG. 9, nozzle management device 80 is provided with control device 200. Control device 200 is provided with controller 202 and multiple drive circuits 206. The multiple drive circuits 206 are connected to pallet housing device 92, nozzle transfer device 94, nozzle cleaning device 96, and nozzle inspection device 98. Controller 202 is provided with a CPU, ROM, RAM, and the like, is formed mainly from a computer, and is connected to the multiple drive circuits 206. Thus, operation of pallet housing device 92, nozzle transfer device 94, and the like, is controlled by controller 202.

Also, controller 202 includes deciding section 210, calculating section 212, and determining section 214. Deciding section 210 is a functional section for deciding boundary lines 190 and 192 based on image data. Calculating section 212 is a functional section for identifying opening 152 based on image data, and calculating the area of the opening for each region divided by boundary lines 190 and 192. Determining section 214 is a functional section for comparing the calculated value of the area calculated for each region to a set value (X/4), and determining whether a suction nozzle 60 is good.

Note that, in an embodiment above, electronic component mounting device 10 is an example of an electronic component mounter. Suction nozzle 60 is an example of a suction nozzle. Opening 152 is an example of an opening. Boundary lines 190 and 192 are examples of a boundary line. Control device 200 is an example of a control device. Deciding section 210 is an example of a deciding section. Calculating section 212 is an example of a calculating section. Determining section 214 is an example of a determining section.

Further, the present disclosure is not limited to the above example embodiments, and various changed or improved methods of embodiment are possible based on the knowledge of someone skilled in the art. Specifically, for example, in an embodiment above, opening 152 identified based on the image data is divided into four regions, but opening 152 identified based on the image data may be divided into any number of multiple regions.

Also, in an embodiment above, inspection of the tip of suction nozzle 60 is performed in nozzle management device 80, but inspection of the tip of suction nozzle 60 may be performed in electronic component mounting device 10.

REFERENCE SIGNS LIST

10: electronic component mounting device (electronic component mounter); 60: suction nozzle; 152: opening; 190: boundary line; 192: boundary line; 200: control device; 210: deciding section; 212: calculating section; 214: determining section

The invention claimed is:

1. A control device comprising:
    a calculating section configured to
        identify an opening of a tip of a suction nozzle used in a component mounter based on image data of the tip of the suction nozzle, the image data including locations that are less than a predetermined brightness level and locations that are equal to or greater than the predetermined brightness level,
        divide the identified opening into multiple regions, and
        calculate an area of the identified opening for each of the multiple regions by subtracting a surface area of the locations that are less than the predetermined brightness level from a surface area of the locations that are equal to or greater than the predetermined brightness level for each of the multiple regions; and
    a determining section configured to determine whether the suction nozzle is good when the area calculated by the calculating section for each of the multiple regions is equal to a predetermined threshold value.

2. The control device according to claim 1, including further comprising:
    a deciding section configured to
        recognize an outer line of the tip of the suction nozzle based on the image data of the tip of the suction nozzle, and
        decide a boundary line of the multiple regions based on the outer line,
    wherein the calculating section is configured to divide the opening identified based on the image data of the tip of the suction nozzle into the multiple regions based on the boundary line decided by the deciding section.

* * * * *

UNITED STATES PATENT AND TRADEMARK OFFICE
CERTIFICATE OF CORRECTION

PATENT NO. : 10,765,051 B2
APPLICATION NO. : 15/758149
DATED : September 1, 2020
INVENTOR(S) : Hideki Hosaka et al.

Page 1 of 1

It is certified that error appears in the above-identified patent and that said Letters Patent is hereby corrected as shown below:

On the Title Page

Item (71), the Applicant's name is incorrect. Item (71) should read:
-- (71) Applicant: FUJI CORPORATION, Chiryu-shi (JP) --

Signed and Sealed this
Third Day of November, 2020

Andrei Iancu
*Director of the United States Patent and Trademark Office*